(12) United States Patent
Anderson et al.

(10) Patent No.: US 9,743,543 B2
(45) Date of Patent: Aug. 22, 2017

(54) ELECTRONICS RACK WITH INTEGRATED ANTI-TIP MECHANISM

(71) Applicant: International Business Machines Corporation, Armonk, NY (US)

(72) Inventors: Dale H. Anderson, Tucson, AZ (US); Angel E. Delgado, Vail, AZ (US); John C. Elliott, Tucson, AZ (US); Grady A. Maass, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 196 days.

(21) Appl. No.: 14/812,380

(22) Filed: Jul. 29, 2015

(65) Prior Publication Data

US 2017/0034935 A1    Feb. 2, 2017

(51) Int. Cl.
| | |
|---|---|
| *B62D 49/08* | (2006.01) |
| *B62D 37/00* | (2006.01) |
| *B62B 3/02* | (2006.01) |
| *B60S 9/00* | (2006.01) |
| *H05K 5/02* | (2006.01) |
| *H05K 7/14* | (2006.01) |
| *F16C 11/04* | (2006.01) |
| *B60B 33/00* | (2006.01) |

(52) U.S. Cl.
CPC ........... *H05K 5/0234* (2013.01); *B60B 33/00* (2013.01); *F16C 11/04* (2013.01); *H05K 7/1488* (2013.01); *B60B 33/0063* (2013.01)

(58) Field of Classification Search
CPC ............ B60R 2021/0018; B62D 49/08; B62D 37/00; B60S 9/00
See application file for complete search history.

(56) References Cited

U.S. PATENT DOCUMENTS

| | | | | |
|---|---|---|---|---|
| 1,146,355 A | * | 7/1915 | Shiling | ................... B60R 19/40 |
| | | | | 116/50 |
| 1,231,531 A | * | 6/1917 | Shiling | ................... B60R 21/00 |
| | | | | 280/755 |

(Continued)

OTHER PUBLICATIONS

"Covermate II™ . . . For Ultimate Safety in Gym Floor Cover Handling", Covermaster Inc., https://system.netsuite.com/core/media/media.nl?id=1112&c=943463&h=1d99936a69ddf8d03011&_xt=. pdf&ck=SmDI_L4CAnIUcbKg&vid=SmDI_L4CAoJUccQb&cktime=131774&ext=F, month unknown, 2005, 2 pages.

(Continued)

*Primary Examiner* — Bryan Evans
(74) *Attorney, Agent, or Firm* — Francis Lammes; Stephen J. Walder, Jr.; Randall J. Bluestone

(57) ABSTRACT

An integrated anti-tip mechanism is provided for aiding prevention of an electronics rack from tipping. The anti-tip mechanism comprises a long portion with a first end and a second end, the first end coupled to a base of the electronics rack and the second end coupled to a first end of a short portion. The first end of the short portion is coupled to the second end of the long portion and a second end of the short portion further coupled to a caster. When deployed, the caster rolls in a same direction as a set of casters beneath the electronics rack. The caster is a predetermined distance off the floor such that the weight of the electronics rack is carried by the set of casters beneath the electronics rack but contact the floor if the electronics rack tips thereby preventing the electronics rack from tipping past a predetermined angle.

20 Claims, 8 Drawing Sheets

(56) References Cited

U.S. PATENT DOCUMENTS

| | | | |
|---|---|---|---|
| 1,932,031 A * | 10/1933 | Bellantese | B60R 21/00 280/755 |
| 3,447,826 A * | 6/1969 | Gostomski | B60R 19/04 280/500 |
| 5,230,408 A | 7/1993 | Sadow | |
| 5,931,499 A * | 8/1999 | Sutherland | B60R 21/00 180/282 |
| 7,374,186 B2 | 5/2008 | Mason et al. | |
| 7,540,510 B2 | 6/2009 | Sparkowski | |
| 2014/0076829 A1 | 3/2014 | Fan et al. | |

OTHER PUBLICATIONS

"Pico 1000", http://www.mack.com/resourse/Pico_1000.pdf, (website no longer available), downloaded Mar. 1, 2015, 5 pages.

"Proline™ Flotek™ FD (Floor Ducted) Server Cabinet", Hoffmanonline.com, Free-Stand Cabinets Proline™ Server Cabinets, http://www.hoffmanonline.com/stream_document.aspx?rRID=105160&pRID=45465, Equipment Protection Solutions, Spec-00165, retrieved from the internet Mar. 1, 2015, 2 pages.

"Retractable Stabilizer Kit for Cabinets", Chatsworth Products Inc., Product Catalog, month unknown, 2004, 2 pages.

"Server Rack Cabinet 46U 42" Deep Open Frame Rack (Model# CRE6046A)", i-techcompany.com, http://www.i-techcompany.com/server-rack-cabinet-enclosures-46u-42inchdeep-cre6046a.html, retrieved from the internet Mar. 1, 2015, 5 pages.

"Server Rack Ordering Guide—Server Rack Information", Service Racks Online, LLC, http://www.server-rack-online.com/server-rack-information.html, retrieved from the Internet Mar. 1, 2015, 7 pages.

"Vibration Isolation Systems Setup Guide", Technical Manufacturing Corporation, https://www.autom8.com/pdfs/tables/Manual_TMC_Setup_Guide.pdf, Apr. 2007, 155 pages.

* cited by examiner

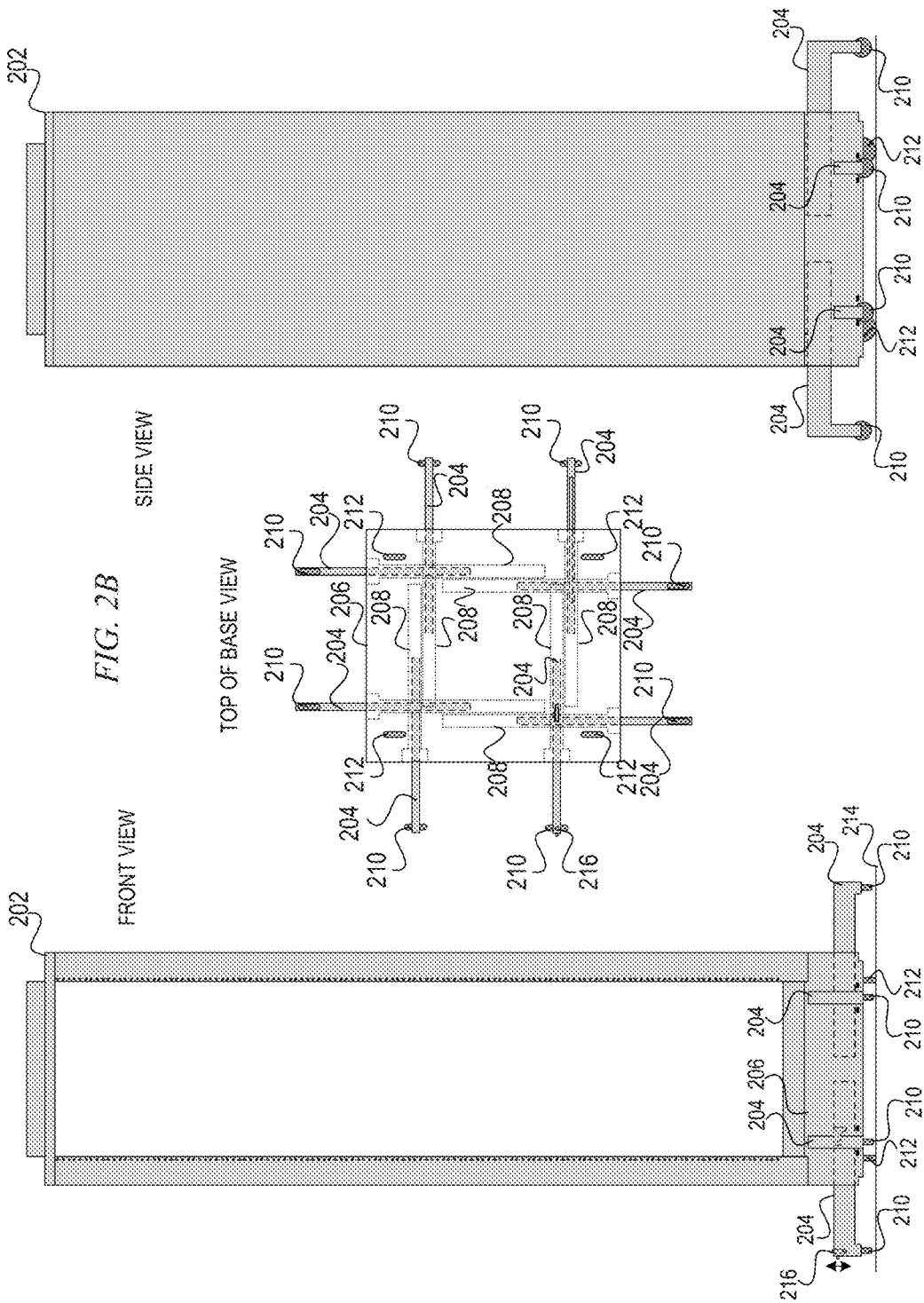

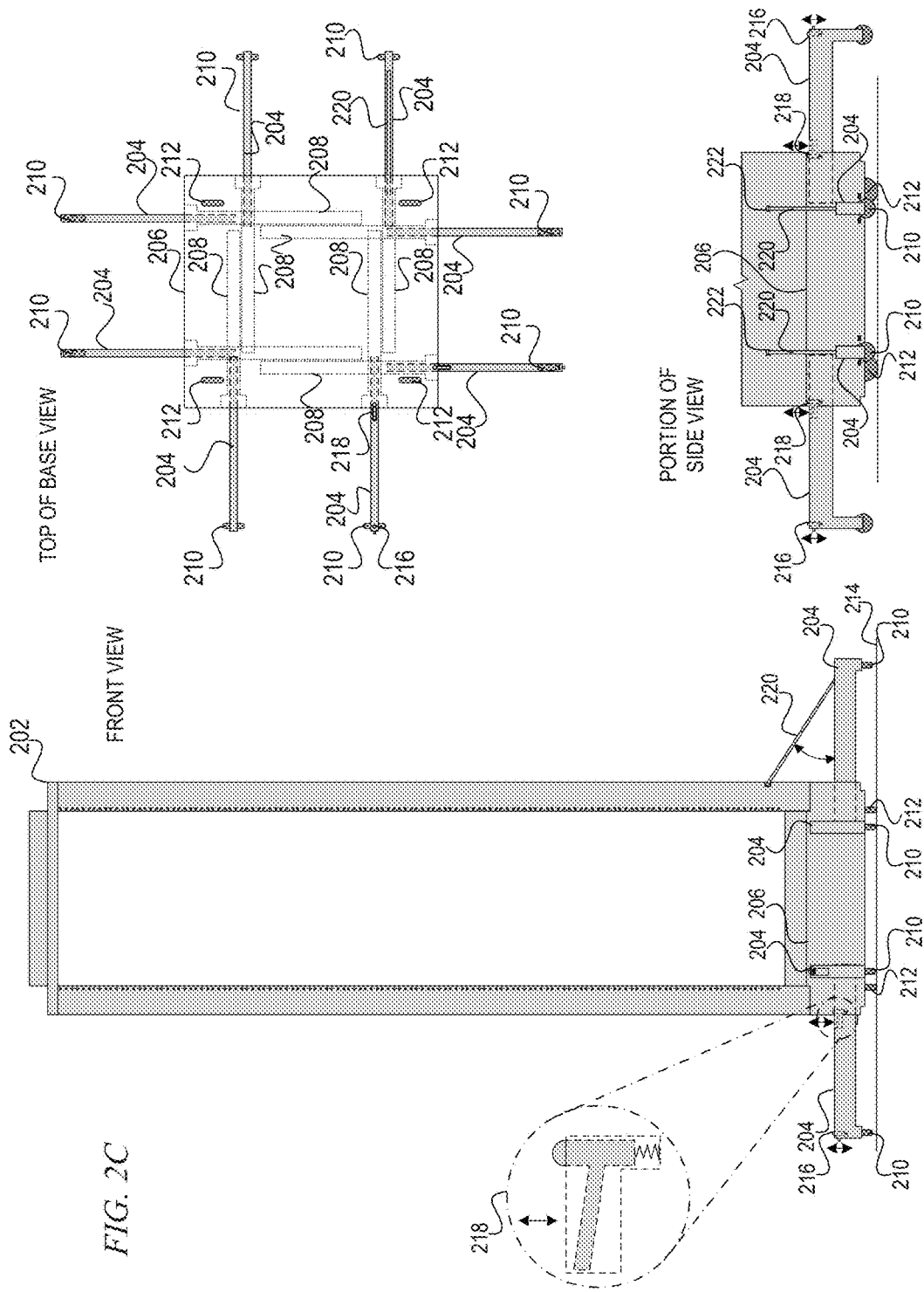

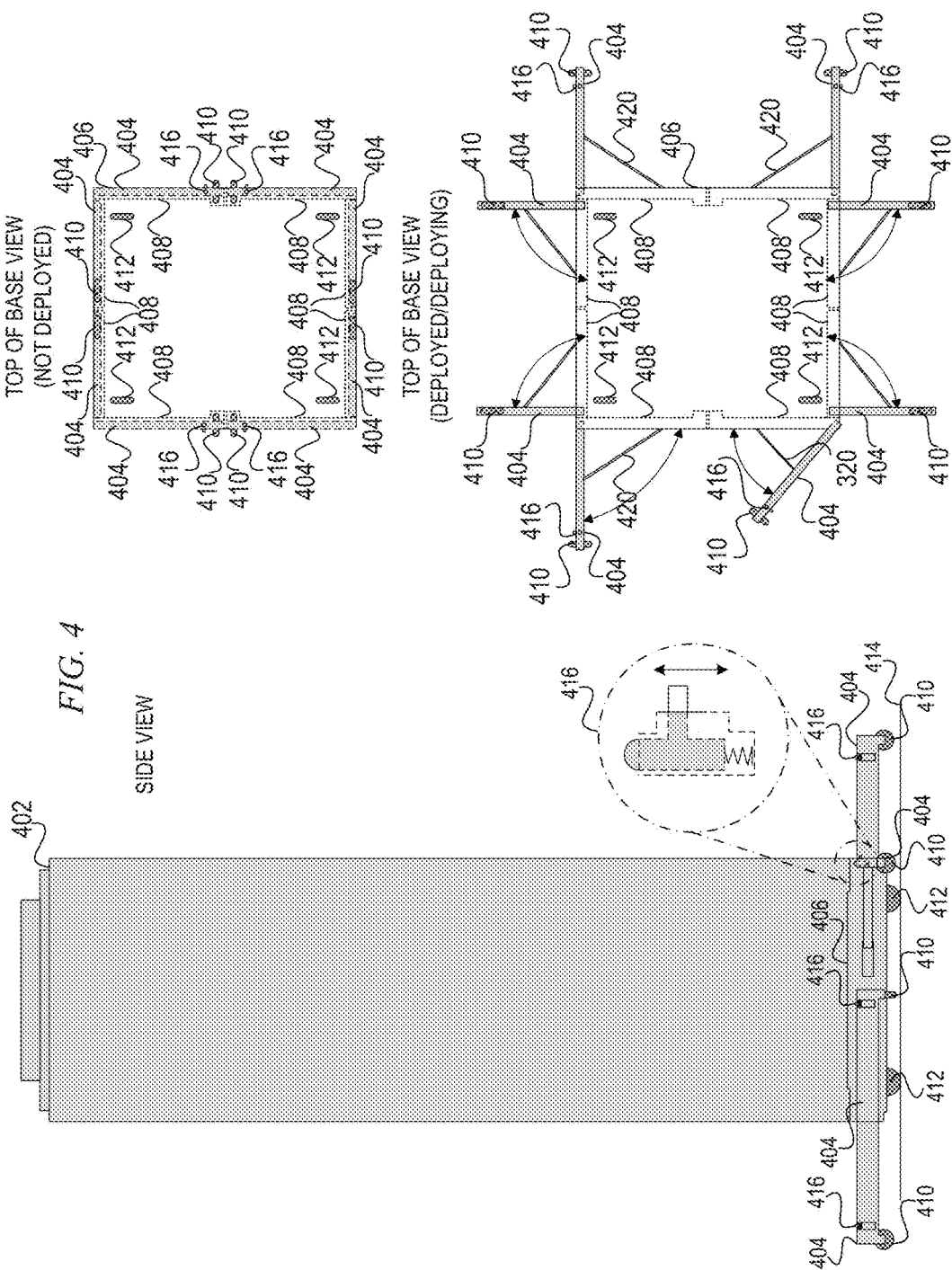

ELECTRONICS RACK WITH INTEGRATED ANTI-TIP MECHANISM

BACKGROUND

The present application relates generally to an improved electronics rack and more specifically to anti-tip mechanisms for preventing the electronics rack from tipping.

Whether a small enterprise has electronic equipment in one room of a data facility or a much larger enterprise has electronic equipment in many rooms in various data facilities all over the world, each of these enterprises may have the need to relocate an electronics rack from one room to another room in a data facility, relocate an electronics rack from one data facility to another data facility, move a new electronics rack from staging/docking/receiving areas into a final install area, after being removed from shipping packaging, pallets, or the like, or moving end-of-service life equipment racks to be moved out of an install area for disposal, reclamation, or recycling. Additionally, raised floors in such data facilities typically have 24" or 0.6 M square floor panels. In order to maximize the floor space efficiency, today's electronics racks are being built as tall as possible and as narrow as possible. That is, in order to further maximize the floor space efficiently, the electronics racks are positioned to fit on the width of one floor panel. With this combination of height and width requirements, electronics racks may be loaded as top heavy thereby creating an unsafe tip hazard when an electronics rack is relocated from one room to another room in a data facility or from one data facility to another data facility, or moved into or out of an original install area.

SUMMARY

In one illustrative embodiment, an integrated anti-tip mechanism is provided for aiding prevention of an electronics rack from tipping. The anti-tip mechanism of the illustrative embodiment includes a long portion with a first end and a second end, the first end coupled to a base of the electronics rack and the second end coupled to a first end of a short portion. The anti-tip mechanism of the illustrative embodiment includes the first end of the short portion coupled to the second end of the long portion and a second end of the short portion further coupled to a caster. The anti-tip mechanism of the illustrative embodiment includes the caster, rolling in a same direction as a set of casters beneath the electronics rack when the anti-tip mechanism is deployed. The anti-tip mechanism of the illustrative embodiment includes the caster being a predetermined distance off the floor such that the weight of the electronics rack is carried by the set of casters beneath the electronics rack but contact the floor if the electronics rack tips thereby preventing the electronics rack from tipping past a predetermined angle when the anti-tip mechanism is deployed.

In another illustrative embodiment, an electronics rack is provided that includes an anti-tip mechanism for aiding prevention of the electronics rack from tipping. The electronics rack of the illustrative embodiment includes a base with one or more integrated anti-tip mechanisms. Each integrated anti-tip mechanism in the one or more integrated anti-tip mechanisms includes a long portion with a first end and a second end, the first end coupled to a base of the electronics rack and the second end coupled to a first end of a short portion; the first end of the short portion coupled to the second end of the long portion and a second end of the short portion further coupled to a caster; the caster, when the integrated anti-tip mechanism is deployed, rolling in a same direction as a set of casters beneath the electronics rack; and the caster, when the integrated anti-tip mechanism is deployed, being a predetermined distance off the floor such that the weight of the electronics rack is carried by the set of casters beneath the electronics rack but contact the floor if the electronics rack tips thereby preventing the electronics rack from tipping past a predetermined angle.

These and other features and advantages of the present invention will be described in, or will become apparent to those of ordinary skill in the art in view of, the following detailed description of the example embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein:

FIGS. 2A-2C depict another embodiment of an integrated anti-tip mechanism for reducing tipping of an electronics rack in accordance with an illustrative embodiment;

FIG. 4 depicts still another embodiment of an integrated anti-tip mechanism for reducing tipping of an electronics rack in accordance with an illustrative embodiment.

DETAILED DESCRIPTION

Figure 1A:
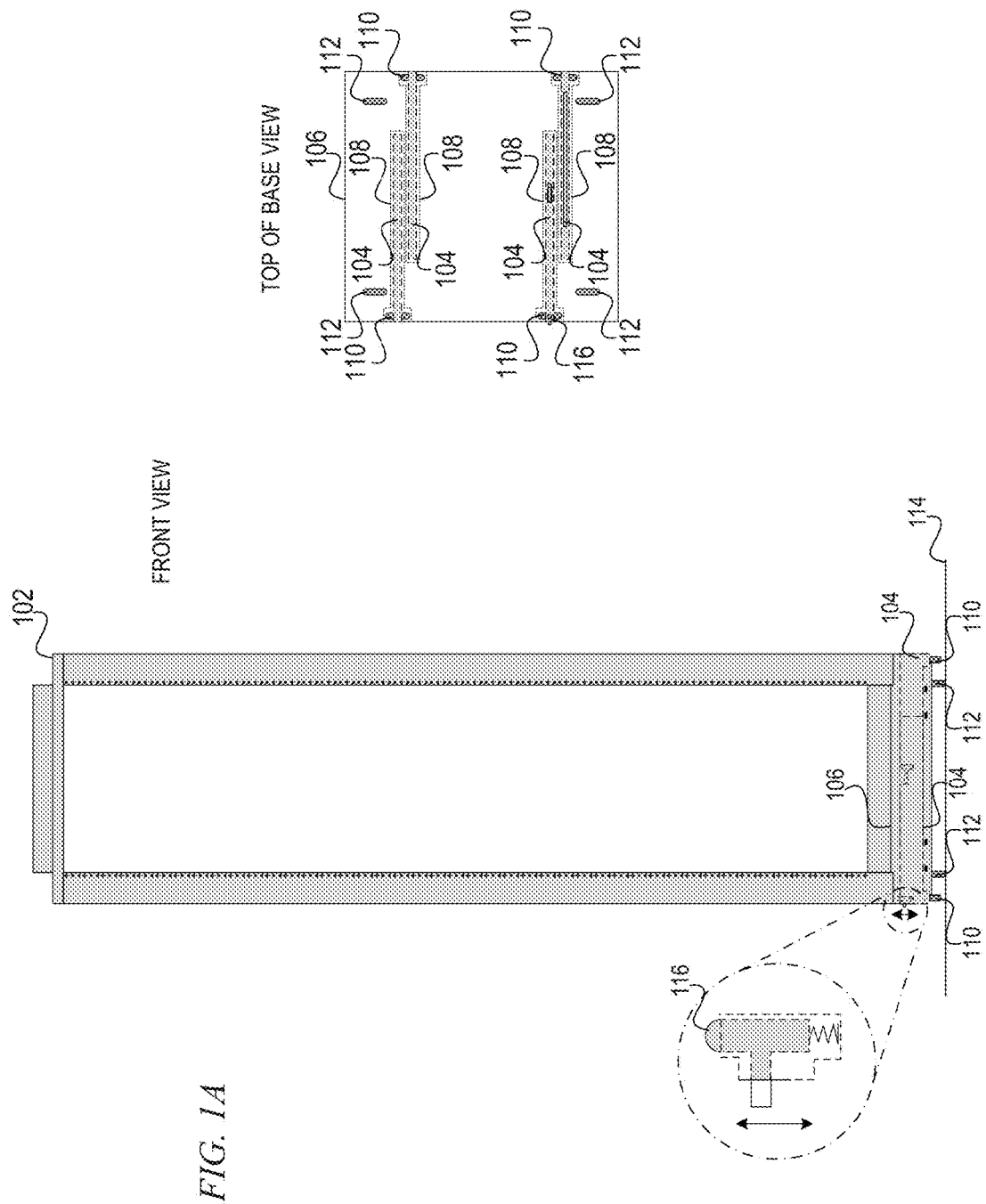
FIGS. 1A-1C depict one embodiment of an integrated anti-tip mechanism for reducing tipping of an electronics rack in accordance with an illustrative embodiment.

Again, at times, enterprises may have the need to relocate an electronics rack from one room to another room in a data facility or from one data facility to another data facility. With current combinations of height and width requirements for electronics racks, such electronics racks may be loaded as top heavy thereby creating an unsafe tip hazard when an electronics rack is relocated from one room to another room in a data facility or from one data facility to another data facility. Currently, temporary caster assemblies are mounted on the sides of the electronics rack when a loaded electronics rack is re-located. Such caster assemblies provide a wider base when moving the electronics rack to improve stability. However, these caster assemblies require bolting to the base of the electronics rack in order to extend the width of the electronics rack which in turn reduces tipping of the electronics rack. The caster assemblies are removed and stored elsewhere once the electronics rack is in place. However, the caster assembly solution becomes an issue when the caster assemblies are forgotten or unknown, misplaced, or simply not readily available, and therefore not utilized at all when making subsequent electronics rack moves thereby presenting a safety hazard. Another current solution to relocating an electronics rack is to require that electronics equipment at the top of the electronics rack be removed in order to safely move the electronics rack. However, removing electronics equipment from an electronics rack is time consuming and has an added risk of damage to electronic components within the electronics equipment, as well as the removal of cables and not replicating the original cabling configuration when re-installing the electronic equipment into the electronics rack.

Thus, the illustrative embodiments provide for integrated anti-tip mechanisms integrated within the electronics rack. The anti-tip mechanisms are integrated such that deployment of the anti-tip mechanisms requires little manual labor as opposed to current anti-tip mechanisms that require bolting to the electronics cabinet. When not deployed, the anti-tip mechanisms stow within the normal footprint of the electronics rack. No added storage space is required for the anti-tip mechanisms and anti-tip protection is always available. The various disclosed designs of the anti-tip mechanisms simplify the use of the anti-tip mechanisms when relocating an electronics rack. The unique feature these anti-tip mechanisms provide is that the anti-tip mechanisms always remain with the electronics rack, so they can never be lost or misplaced. The anti-tip mechanisms may be easily deployed during relocation and stowed when not required.

In order to better understand the improvements and advantages afforded by the mechanisms of the illustrative embodiments, it is first important to understand the currently used electronics racks that have electronic equipment mounted within. In particular, the mechanisms of the illustrative embodiments are especially well suited for protecting electronics racks that house expensive electronics server computing systems, internet computing systems, communication equipment, or the like that may be damaged if an electronics rack were to tip over during relocation. One implementation of the illustrative embodiments is an anti-tip arm mechanism integrated within the electronics rack for aiding in relocation of the electronics rack such that if the electronics rack starts to tip during relocation the anti-tip arm mechanisms provide structural bracing for the electronics rack. The anti-tip arm mechanisms not only provide security for the electronics equipment in the electronics rack but further provide protection to persons moving or around such heavy and sensitive electronic equipment when dynamically in motion. That is, in the event of an unforeseen obstruction that may block the primary rolling castors causing the electronics rack with the electronics equipment to suddenly stop, turn, and attempt to keel over, the electronics rack loaded with electronics equipment with its own large momentum may be too much for a person to stabilize, brace, or perhaps react quick enough. Thus, the anti-tip arm mechanisms integrated within the electronics rack aids in relocation of the electronics rack in cases where the electronics rack starts to tip.

Before beginning the discussion of the various aspects of the illustrative embodiments, it should first be appreciated that throughout this description the term "mechanism" will be used to refer to elements of the present invention that perform various operations, functions, and the like. A "mechanism," as the term is used herein, may be an implementation of the functions or aspects of the illustrative embodiments in the form of an apparatus, equipment, or device.

The present description and claims may make use of the terms "a," "at least one of," and "one or more of" with regard to particular features and elements of the illustrative embodiments. It should be appreciated that these terms and phrases are intended to state that there is at least one of the particular feature or element present in the particular illustrative embodiment, but that more than one can also be present. That is, these terms/phrases are not intended to limit the description or claims to a single feature/element being present or require that a plurality of such features/elements be present. To the contrary, these terms/phrases only require at least a single feature/element with the possibility of a plurality of such features/elements being within the scope of the description and claims.

In addition, it should be appreciated that the following description uses a plurality of various examples for various elements of the illustrative embodiments to further illustrate example implementations of the illustrative embodiments and to aid in the understanding of the mechanisms of the illustrative embodiments. These examples intended to be non-limiting and are not exhaustive of the various possibilities for implementing the mechanisms of the illustrative embodiments. It will be apparent to those of ordinary skill in the art in view of the present description that there are many other alternative implementations for these various elements that may be utilized in addition to, or in replacement of, the examples provided herein without departing from the spirit and scope of the present invention.

Figure 1B:
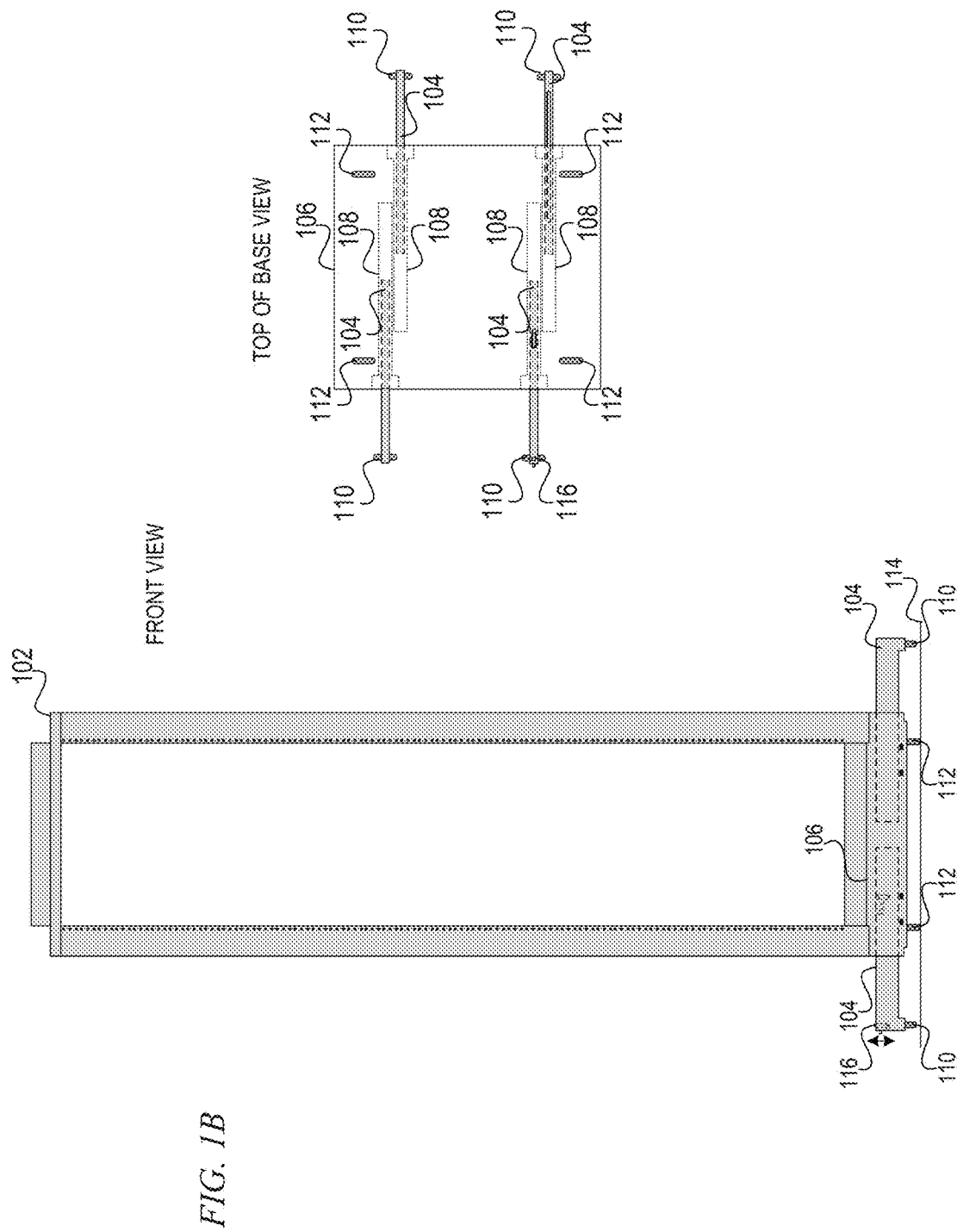
Figure 1C:
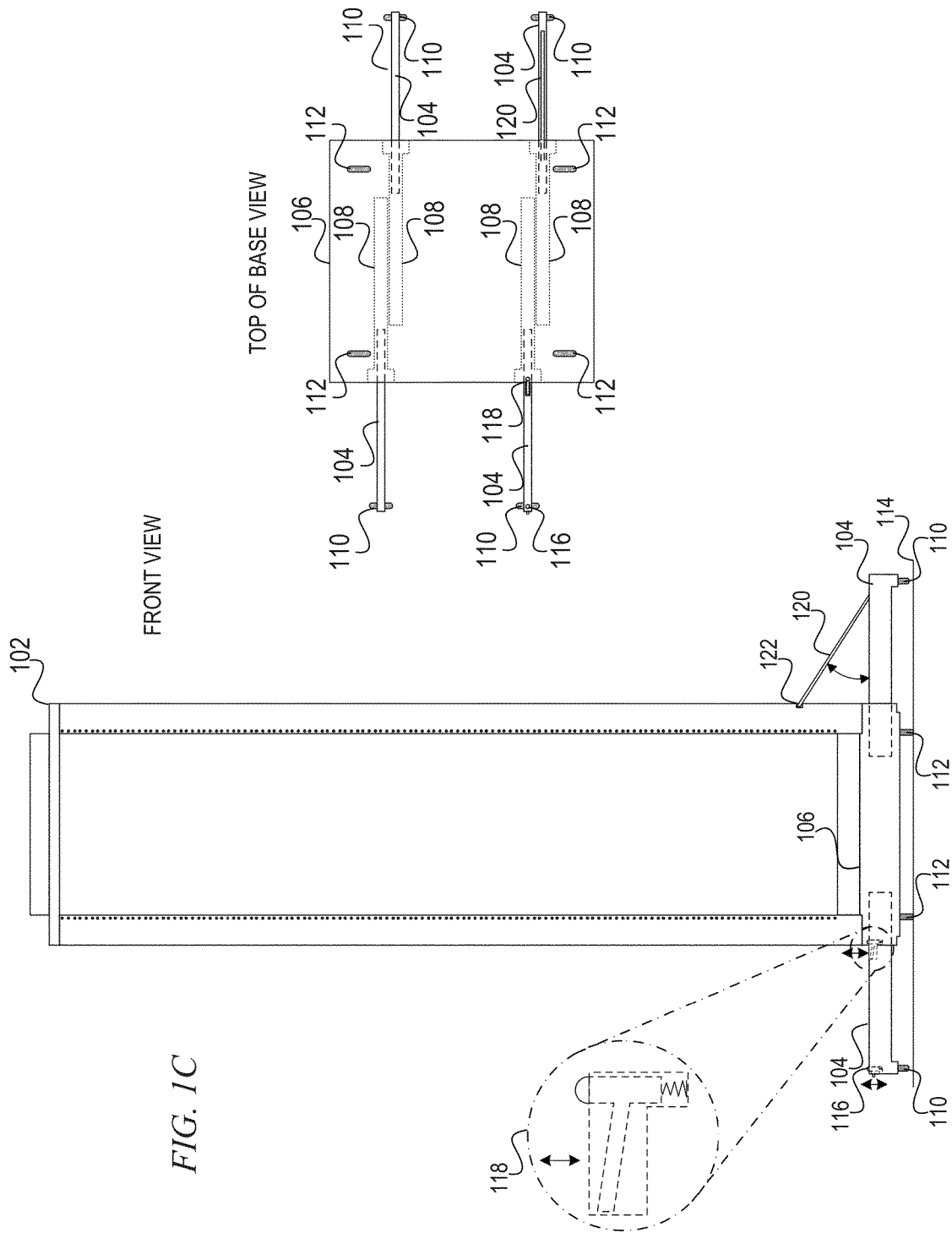

FIGS. 1A-1C depict one embodiment of an integrated anti-tip mechanism for reducing tipping of an electronics rack in accordance with an illustrative embodiment. In FIG. 1A, electronics rack 102 comprises two sets of anti-tip caster arms 104 that are fully retracted into base 106 of electronics rack 102. Each of anti-tip caster arms 104 may be comprised out of steel, aluminum, carbon fiber, or any other structurally sound material. Each anti-tip caster arm 104 comprises a long portion that slides into a respective anti-tip caster arm holding channel 108 in base 106 and each anti-tip caster arm 104 is located in close proximity to casters 112 so as to not impede movement of electronics rack 102 when going from a flat surface to an incline or an incline to a flat surface. Each of anti-tip caster arm holding channels 108 may be comprised out of steel, aluminum, carbon fiber, or any other structurally sound material that may be attached to base 106 by attachment means such as bolting, welding, or the like.

Each anti-tip caster arm 104 also comprises a short portion that is perpendicular to the long portion which houses a caster 110 that is perpendicular to anti-tip caster arm 104 such that the caster rolls in the same direction as casters 112 of electronics rack 102. However, as opposed to casters 112, casters 110 are not normally in contact with floor 114. That is, casters 110 are positioned slightly (such as in the range of 2 millimeters to 5 millimeters) above floor 114 and may only come into contact with floor 114 when anti-tip caster arms are fully deployed and electronics rack 102 tips. Thus, the weight of electronics rack 102 is supported by casters 112 which are in fixed locations within electronics rack 102. In the retracted position shown in FIG. 1A the arms do not extend beyond the footprint of base 106 of electronics rack 102 and are held in the retracted position by a suitable latching mechanism, such as the illustrated spring button 116 or other latching mechanism within anti-tip caster arm 104 or attached to electronics rack 102, such as a spring lever that is mounted to anti-tip caster arm holding channel 108 that engages into holes or detents in anti-tip caster arm 104.

FIG. 1B illustrates anti-tip caster arms 104 being extended from base 106 of electronics rack 102. As is illustrated, by depressing spring button 116, each anti-tip caster arm 104 slides out of its respective anti-tip caster arm holding channel 108 toward the sides of electronics rack 102. Again, as opposed to casters 112, casters 110 are positioned slightly (such as in the range of 2 millimeters to 5 millimeters) above floor 114 and may only come into contact with floor 114 when anti-tip caster arms are fully deployed and electronics rack 102 tips.

FIG. 1C illustrates anti-tip caster arms 104 being fully extended from base 106 of electronics rack 102. As each anti-tip caster arm 104 slides out of its respective anti-tip caster arm holding channel 108 toward the sides of electronics rack 102, anti-tip caster arm 104 may be held in place by one of two mechanisms, which are both illustrated in FIG. 1C. The first mechanism may be spring button 118 that may be comprised within anti-tip caster arm 104. As the anti-tip caster arm 104 slides out of its respective anti-tip caster arm holding channel 108 toward the sides of electronics rack 102, when a predetermined length has been reached, spring button 118 springs upward into the hole that held caster arm in place when anti-tip caster arm 104 was fully retracted thereby holding anti-tip caster arm 104 in place.

The second mechanism is brace 120 that may also be comprised within anti-tip caster arm 104. Brace 120 is comprised within a top channel of anti-tip caster arm 104 such that brace 120 is attached at one end at a position close to a caster end of anti-tip caster arm 104 and brace 120 lays flat in the top channel. As the anti-tip caster arm 104 slides out of its respective anti-tip caster arm holding channel 108 toward the sides of electronics rack 102, the caster arm slides out past the predetermined length. However, the user takes hold of a non-attached end of brace 120 and lifts it upwards to a predetermined angle. The anti-tip caster arm 104 is then slid back into anti-tip caster arm holding channel 108 and the non-attached end of brace 120 is locked into brace attaching mechanism 122 on the side of electronics rack 102. As is illustrated, in the fully deployed state, as opposed to casters 112, casters 110 are positioned slightly (such as in the range of 2 millimeters to 5 millimeters) above floor 114 and may only come into contact with floor 114 when anti-tip caster arms are fully deployed and electronics rack 102 tips.

While the illustrative embodiments described in FIGS. 1A-1C depict a spring button mechanism and a bracing mechanism for locking the anti-tip arm mechanism in place once deployed, the illustrative embodiments are not limited to such and any locking mechanism may be utilized in the illustrative embodiments, e.g., hole and pin mechanism, a turning tumbler mechanism, a spring lever mechanism, or the like.

Figure 2A:
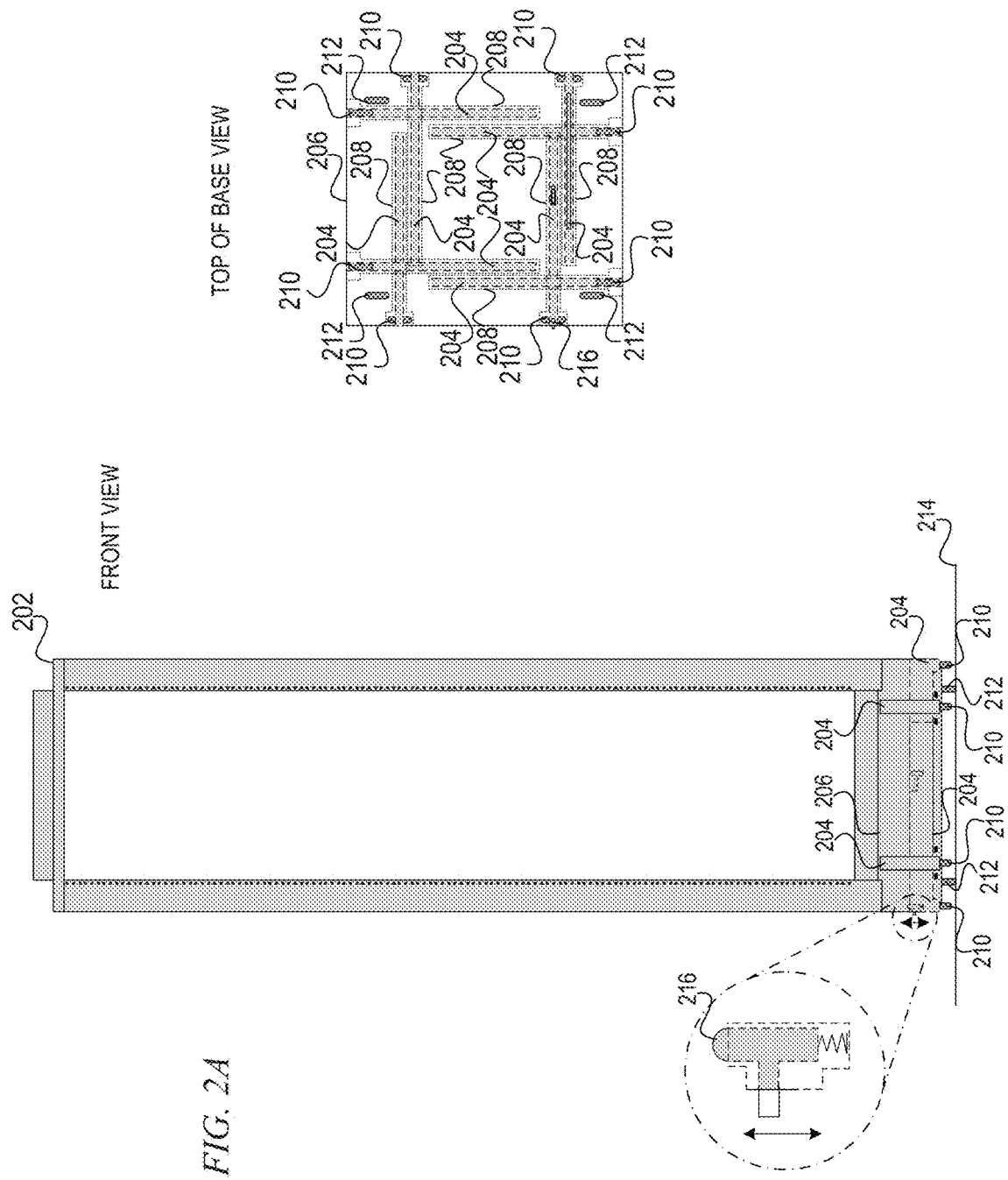

FIGS. 2A-2C depict another embodiment of an integrated anti-tip mechanism for reducing tipping of an electronics rack in accordance with an illustrative embodiment. In difference to electronics rack 102 in FIGS. 1A-1C, in FIG. 2A, electronics rack 202 comprises four sets of anti-tip caster arms 204 that are fully retracted into base 206 of electronics rack 202. Two of the four sets of anti-tip caster arms 204 deploy to the sides of electronics rack 202 and the other two sets of anti-tip caster arms deploy to the front and back of electronics rack 202. As is illustrated, the two sets of anti-tip caster arms 204 that deploy to the sides are comprised in a first level of base 206 while the two sets of anti-tip caster arms 204 that deploy to the front and back are comprised in a second level of base 206. Each of anti-tip caster arms 204 may be comprised out of steel, aluminum, carbon fiber, or any other structurally sound material. Each anti-tip caster arm 204 comprises a long portion that slides into a respective anti-tip caster arm holding channel 208 in base 206 and each anti-tip caster arm 204 is located in close proximity to casters 212 so as to not impede movement of electronics rack 202 when going from a flat surface to an incline or an incline to a flat surface. Each of anti-tip caster arm holding channels 208 may be comprised out of steel, aluminum, carbon fiber, or any other structurally sound material that may be attached to base 206 by attachment means such as bolting, welding, or the like.

Each anti-tip caster arm 204 that deploys to the side comprises a short portion that is perpendicular to the long portion and houses a caster 210 that is perpendicular to anti-tip caster arm 204 such that the caster rolls in the same direction as casters 212 of electronics rack 202. Each anti-tip caster arm 204 that deploys to the front and back also comprises a short portion that is perpendicular to the long portion which houses a caster 210 that is parallel to anti-tip caster arm 204 such that the caster rolls in the same direction as casters 212 of electronics rack 202. However, as opposed to casters 212, casters 210 are not normally in contact with floor 214. That is, casters 210 are positioned slightly (such as in the range of 2 millimeters to 5 millimeters) above floor 214 and may only come into contact with floor 214 when anti-tip caster arms are fully deployed and electronics rack 202 tips. Thus, the weight of electronics rack 202 is supported by casters 212 which are in fixed locations within electronics rack 202. In the retracted position shown in FIG. 2A the arms do not extend beyond the footprint of base 206 of electronics rack 202 and are held in the retracted position by spring button 216.

FIG. 2B illustrates anti-tip caster arms 204 being extended from base 206 of electronics rack 202. As is illustrated, by depressing spring button 216, each anti-tip caster arm 204 slides out of its respective anti-tip caster arm holding channel 208 toward the sides of electronics rack 202. Again, as opposed to casters 212, casters 210 are positioned slightly (such as in the range of 2 millimeters to 5 millimeters) above floor 214 and may only come into contact with floor 214 when anti-tip caster arms are fully deployed and electronics rack 202 tips.

FIG. 2C illustrates anti-tip caster arms 204 being fully extended from base 206 of electronics rack 202. After releasing anti-tip caster arm 204 via spring button 216, as each anti-tip caster arm 204 slides out of its respective anti-tip caster arm holding channel 208 toward the sides of electronics rack 202, anti-tip caster arm 204 may be held in place by one of two mechanisms, which are both illustrated in FIG. 2C. The first mechanism may be spring button 218 that may be comprised within anti-tip caster arm 204. As the anti-tip caster arm 204 slides out of its respective anti-tip caster arm holding channel 208 toward the sides of electronics rack 202, when a predetermined length has been reached, spring button 218 springs upward into the hole that held caster arm in place when anti-tip caster arm 204 was fully retracted thereby holding anti-tip caster arm 204 in place.

The second mechanism is brace 220 that may also be comprised within anti-tip caster arm 204. Brace 220 is comprised within a top channel of anti-tip caster arm 204 such that brace 220 is attached at one end at a position close to a caster end of anti-tip caster arm 204 and brace 220 lays flat in the top channel. As the anti-tip caster arm 204 slides out of its respective anti-tip caster arm holding channel 208 toward the sides of electronics rack 202, the caster arm slides out past the predetermined length. However, the user takes hold of a non-attached end of brace 220 and lifts it upwards to a predetermined angle. The anti-tip caster arm 204 is then slid back into anti-tip caster arm holding channel 208 and the non-attached end of brace 220 is locked into brace attaching mechanism 222 on the side of electronics rack 220. As is illustrated, in the fully deployed state, as opposed to casters 212, casters 210 are positioned slightly (such as in the range of 2 millimeters to 5 millimeters) above floor 214 and may only come into contact with floor 214 when anti-tip caster arms are fully deployed and electronics rack 202 tips.

While the illustrative embodiments described in FIG. 2A-2C depict a spring button mechanism and a bracing mechanism for locking the anti-tip arm mechanism in place once deployed, the illustrative embodiments are not limited to such and any locking mechanism may be utilized in the illustrative embodiments, e.g., hole and pin mechanism, a turning tumbler mechanism, a spring lever mechanism, or the like. Further, while the illustrative embodiments described in FIG. 2A-2C depict the two sets of anti-tip caster arms 204 that deploy to the sides being in the first level closest to the floor 214 and the two sets of anti-tip caster arms 204 that deploy to the front and back being in the second level above the first level, the illustrative embodiment recognize that the two sets of anti-tip caster arms 204 that deploy to front and back may be in the first level closest to the floor 214 and the two sets of anti-tip caster arms 204 that deploy to the sides may be in the second level above the first level.

Figure 3:
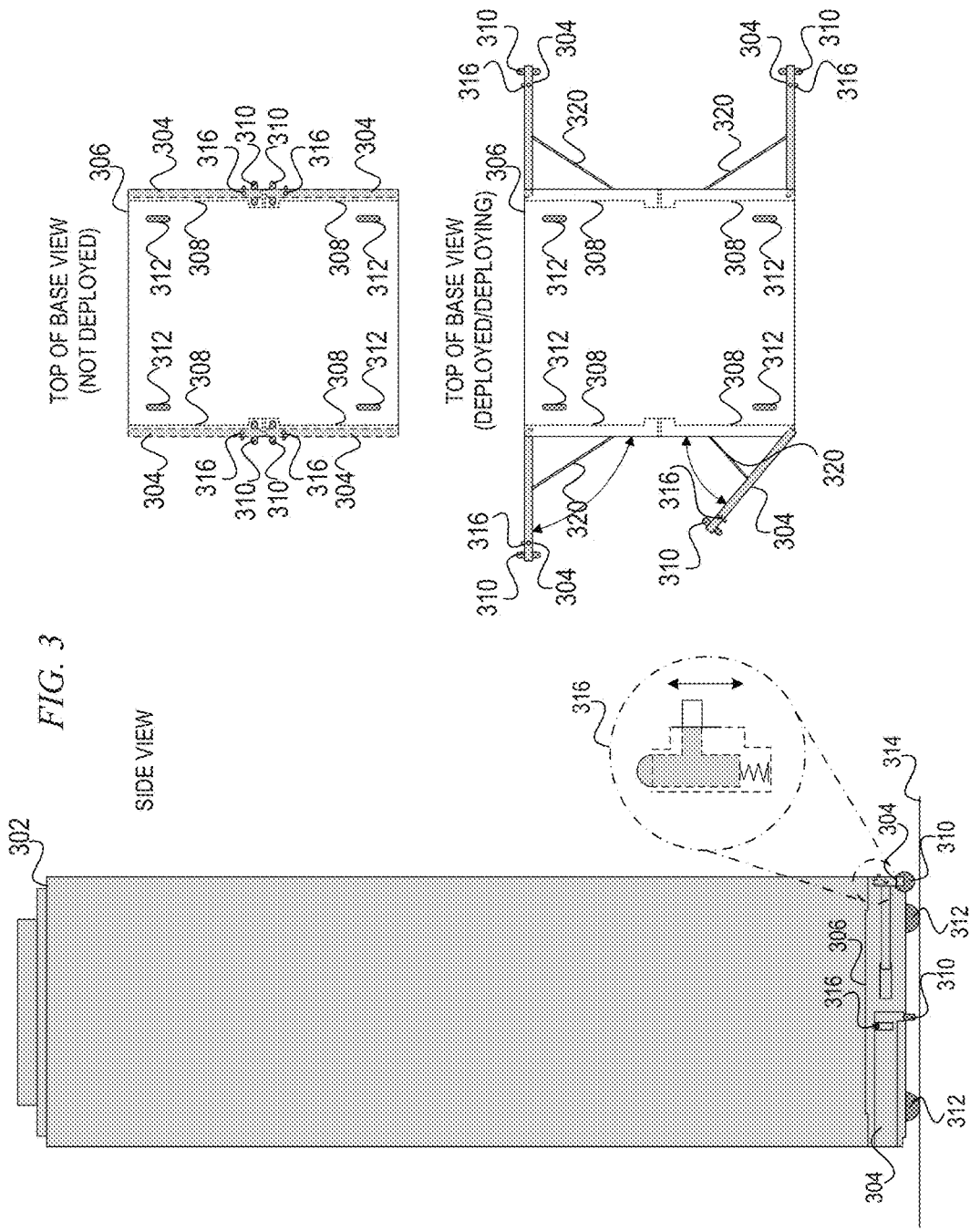
FIG. 3 depicts yet another embodiment of an integrated anti-tip mechanism for reducing tipping of an electronics rack in accordance with an illustrative embodiment.

FIG. 3 depicts yet another embodiment of an integrated anti-tip mechanism for reducing tipping of an electronics rack in accordance with an illustrative embodiment. In FIG. 3, electronics rack 302 comprises two sets of anti-tip caster arms 304 that are fully retracted into the sides of base 306 of electronics rack 302. Each of anti-tip caster arms 304 may be comprised out of steel, aluminum, carbon fiber, or any other structurally sound material. Each anti-tip caster arm 304 comprises a long portion coupled to a short portion that is perpendicular to the long portion. The short portion houses a caster 310 that is perpendicular to anti-tip caster arm 304 such that the caster rolls in the same direction as casters 312 of electronics rack 302. Each of anti-tip caster arms 304 fold into a respective anti-tip caster arm holding channel 308 on the side of base 306 and rotates around a pivot point that is close to the corner of base 306 so as to not impede movement of electronics rack 302 when going from a flat surface to an incline or an incline to a flat surface. Each of anti-tip caster arm holding channels 308 may be comprised out of steel, aluminum, carbon fiber, or any other structurally sound material.

As opposed to casters 312, casters 310 are not normally in contact with floor 314. That is, casters 310 are positioned slightly (such as in the range of 2 millimeters to 5 millimeters) above floor 314 and may only come into contact with floor 314 when anti-tip caster arms are fully deployed and electronics rack 302 tips. Thus, the weight of electronics rack 302 is supported by casters 312 which are in fixed locations within electronics rack 302. In the retracted position shown in FIG. 3 the arms do not extend beyond the footprint of base 306 of electronics rack 302 and are held in the retracted position by spring button 316. As is illustrated, by depressing spring button 316, each anti-tip caster arm 304 folds out of its respective anti-tip caster arm holding channel 308 toward the sides of electronics rack 302. Again, as opposed to casters 312, casters 310 are positioned slightly (such as in the range of 2 millimeters to 5 millimeters) above floor 314 and may only come into contact with floor 314 when anti-tip caster arms are fully deployed and electronics rack 302 tips.

As each anti-tip caster arm 304 folds out of its respective anti-tip caster arm holding channel 308 toward the sides of electronics rack 302, anti-tip caster arm 304 is held in place by brace 320 that may also be comprised within anti-tip caster arm 304. Brace 320 is comprised within a side channel of anti-tip caster arm 304 such that brace 320 is attached at one end at a position close to a caster end of anti-tip caster arm 304 and brace 320 lays flat in the side channel. As the anti-tip caster arm 304 folds out of its respective anti-tip caster arm holding channel 308 toward the sides of electronics rack 302, the anti-tip caster arm 304 locks into place when the anti-tip caster arm reaches 90 degrees with respect to the side of electronics rack 302. The locking mechanism for brace 320 may be a spring lock mechanism, a pin lock mechanism, a spring lever mechanism, or the like.

FIG. 4 depicts still another embodiment of an integrated anti-tip mechanism for reducing tipping of an electronics rack in accordance with an illustrative embodiment. In difference to electronics rack 302 in FIG. 3, in FIG. 4, electronics rack 402 comprises four sets of anti-tip caster arms 404 that are fully retracted into base 406 of electronics rack 402. Two of the four sets of anti-tip caster arms 404 deploy to the sides of electronics rack 402 and the other two sets of anti-tip caster arms deploy to the front and back of electronics rack 402. Each of anti-tip caster arms 404 may be comprised out of steel, aluminum, carbon fiber, or any other structurally sound material. Each anti-tip caster arm 404 comprises a long portion that folds into a respective anti-tip caster arm holding channel 408 in base 406 and each anti-tip caster arm 404 is located in close proximity to casters 412 so as to not impede movement of electronics rack 402 when going from a flat surface to an incline or an incline to a flat surface. Each anti-tip caster arm 404 that deploys to the side comprises a short portion that is perpendicular to the long portion and houses a caster 410 that is parallel to anti-tip caster arm 404 such that, when deployed, the caster rolls in the same direction as casters 412 of electronics rack 402. Each anti-tip caster arm 404 that deploys to the front and back also comprises a short portion that is perpendicular to the long portion which houses a caster 410 that is perpendicular to anti-tip caster arm 404 such that, when deployed, the caster rolls in the same direction as casters 412 of electronics rack 402. Each of anti-tip caster arms 404 fold into a respective anti-tip caster arm holding channel 408 on the side of base 406 and rotates around a pivot point that is close to the corner of base 406 so as to not impede movement of electronics rack 402 when going from a flat surface to an incline or an incline to a flat surface. Each of anti-tip caster arm holding channels 308 may be comprised out of steel, aluminum, carbon fiber, or any other structurally sound material.

As opposed to casters 412, casters 410 are not normally in contact with floor 414. That is, casters 410 are positioned slightly (such as in the range of 2 millimeters to 5 millimeters) above floor 414 and may only come into contact with floor 414 when anti-tip caster arms are fully deployed and electronics rack 402 tips. Thus, the weight of electronics rack 402 is supported by casters 412 which are in fixed locations within electronics rack 402. In the retracted position shown in FIG. 4 the arms do not extend beyond the footprint of base 406 of electronics rack 402 and are held in the retracted position by spring button 416. As is illustrated, by depressing spring button 416, each anti-tip caster arm 404 that deploys to the side folds out of its respective anti-tip caster arm holding channel 408 toward the sides of electronics rack 402 and each anti-tip caster arm 404 that deploys to the front and the back folds out of its respective anti-tip caster arm holding channel 408 toward the front and back of electronics rack 402, respectively. Again, as opposed to casters 412, casters 410 are positioned slightly (such as in the range of 2 millimeters to 5 millimeters) above floor 414 and may only come into contact with floor 414 when anti-tip caster arms are fully deployed and electronics rack 402 tips.

As each anti-tip caster arm 404 folds out of its respective anti-tip caster arm holding channel 408 toward the sides, front, or back of electronics rack 402, anti-tip caster arm 404 is held in place by brace 420 that may also be comprised within anti-tip caster arm 404. Brace 420 is comprised within a side channel of anti-tip caster arm 404 such that brace 420 is attached at one end at a position close to a caster end of anti-tip caster arm 404 and brace 420 lays flat in the side channel. As the anti-tip caster arm 404 folds out of its respective anti-tip caster arm holding channel 408 toward the sides of electronics rack 402, the anti-tip caster arm 404 locks into place when the anti-tip caster arm reaches 90 degrees with respect to the side of electronics rack 402. The locking mechanism for brace 420 may be a spring lock mechanism, a pin lock mechanism, a spring lever mechanism, or the like.

It should be appreciated that the above description provides examples of configurations of the anti-tip mechanism of the present invention, but the present invention is not limited to these particular example configurations. To the contrary, many modifications can be made to the example configurations without departing from the spirit and scope of the illustrative embodiments.

Thus, the illustrative embodiments provide mechanisms for integrated anti-tip mechanisms integrated within the electronics rack. The anti-tip mechanisms are integrated such that deployment of the anti-tip mechanisms requires little manual labor as opposed to current anti-tip mechanisms that require bolting to the electronics cabinet. When not deployed, the anti-tip mechanisms stow within the normal footprint of the electronics rack. No added storage space is required for the anti-tip mechanisms and anti-tip protection is always available. The various disclosed designs of the anti-tip mechanisms simplify the use of the anti-tip mechanisms when relocating an electronics rack. The unique feature these anti-tip mechanisms provide is that the anti-tip mechanisms always remain with the electronics rack, so they can never be lost or misplaced. The anti-tip mechanisms may be easily deployed during relocation and stowed when not required.

The description of the present invention has been presented for purposes of illustration and description, and is not intended to be exhaustive or limited to the invention in the form disclosed. Many modifications and variations will be apparent to those of ordinary skill in the art without departing from the scope and spirit of the described embodiments. The embodiment was chosen and described in order to best explain the principles of the invention, the practical application, and to enable others of ordinary skill in the art to understand the invention for various embodiments with various modifications as are suited to the particular use contemplated. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated anti-tip mechanism for aiding prevention of an electronics rack from tipping, the anti-tip mechanism comprising:
    a long portion with a first end and a second end, the first end coupled to a base of the electronics rack and the second end coupled to a first end of a short portion;
    the first end of the short portion coupled to the second end of the long portion and a second end of the short portion further coupled to a caster;
    the caster, when the anti-tip mechanism is deployed, rolling in a same direction as a set of casters beneath the electronics rack; and
    the caster, when the anti-tip mechanism is deployed, being a predetermined distance off the floor such that the weight of the electronics rack is carried by the set of casters beneath the electronics rack but contact the floor if the electronics rack tips thereby preventing the electronics rack from tipping past a predetermined angle.

2. The integrated anti-tip mechanism of claim 1, wherein the anti-tip mechanism integrated into the base of the electronics rack through an anti-tip mechanism holding channel in which the long portion slides into the channel.

3. The integrated anti-tip mechanism of claim 2, wherein the anti-tip mechanism is held into a fully retracted position in the anti-tip mechanism holding channel by a latching mechanism.

4. The integrated anti-tip mechanism of claim 2, wherein the anti-tip mechanism is held into a fully deployed position in the anti-tip mechanism holding channel by a latching mechanism.

5. The integrated anti-tip mechanism of claim 2, wherein the anti-tip mechanism is held into a fully deployed position in the anti-tip mechanism holding channel by a bracing mechanism that braces the anti-tip mechanism to a side of the electronics rack.

6. The integrated anti-tip mechanism of claim 1, wherein the anti-tip mechanism is integrated into the base of the electronics rack via a pivot mechanism.

7. The integrated anti-tip mechanism of claim 6, wherein the anti-tip mechanism is held into a fully retracted position parallel to a side of the base of the electronics rack by a latching mechanism.

8. The integrated anti-tip mechanism of claim 6, wherein the anti-tip mechanism is held into a fully deployed position perpendicular to a side of the base of the electronics rack by a bracing mechanism that braces the anti-tip mechanism to a side of the electronics rack.

9. The integrated anti-tip mechanism of claim 1, wherein the anti-tip mechanism is integrated into a base of the electronics rack at a position in close proximity to the set of casters beneath the electronics rack so as to not impede movement of the electronics rack.

10. An electronics rack comprising an anti-tip mechanism for aiding prevention of the electronics rack from tipping, the electronics rack comprising:
    a base with one or more integrated anti-tip mechanisms, each integrated anti-tip mechanism in the one or more integrated anti-tip mechanisms comprising:
        a long portion with a first end and a second end, the first end coupled to a base of the electronics rack and the second end coupled to a first end of a short portion:
        the first end of the short portion coupled to the second end of the long portion and a second end of the short portion further coupled to a caster;
        the caster, when the integrated anti-tip mechanism is deployed, rolling in a same direction as a set of casters beneath the electronics rack; and
        the caster, when the integrated anti-tip mechanism is deployed, being a predetermined distance off the floor such that the weight of the electronics rack is carried by the set of casters beneath the electronics rack but contact the floor if the electronics rack tips thereby preventing the electronics rack from tipping past a predetermined angle.

11. The electronics rack of claim 10, wherein the integrated anti-tip mechanism integrated into the base of the electronics rack through an integrated anti-tip mechanism holding channel in which the long portion slides into the channel.

12. The electronics rack of claim 11, wherein the integrated anti-tip mechanism is held into a fully retracted position in the integrated anti-tip mechanism holding channel by a latching mechanism.

13. The electronics rack of claim 11, wherein the integrated anti-tip mechanism is held into a fully deployed position in the integrated anti-tip mechanism holding channel by a latching mechanism.

14. The electronics rack of claim 11, wherein the integrated anti-tip mechanism is held into a fully deployed position in the integrated anti-tip mechanism holding channel by a bracing mechanism that braces the integrated anti-tip mechanism to a side of the electronics rack.

15. The electronics rack of claim 10, wherein the integrated anti-tip mechanism integrates into the base of the electronics rack via a pivot mechanism.

16. The electronics rack of claim 15, wherein the integrated anti-tip mechanism is held into a fully retracted position parallel to a side of the base of the electronics rack by a latching mechanism.

17. The electronics rack of claim 15, wherein the integrated anti-tip mechanism is held into a fully deployed position perpendicular to a side of the base of the electronics rack by a bracing mechanism that braces the integrated anti-tip mechanism to a side of the electronics rack.

18. The electronics rack of claim 10, wherein the integrated anti-tip mechanism is integrated into the base of the electronics rack at a position in close proximity to the set of casters beneath the electronics rack so as to not impede movement of the electronics rack.

19. The electronics rack of claim 10, wherein the one or more integrated anti-tip mechanisms is two sets of integrated anti-tip mechanisms, wherein a first set of the two sets of integrated anti-tip mechanisms is located at the front of the electronics rack and deploys to the sides of the electronics rack and a second set of the two sets of integrated anti-tip mechanisms is located at the back of the electronics rack and deploys to the sides of the electronics rack.

20. The electronics rack of claim 10, wherein the one or more integrated anti-tip mechanisms is four sets of integrated anti-tip mechanisms, wherein a first set of the four sets of integrated anti-tip mechanisms is located at the front of the electronics rack and deploys to the sides of the electronics rack, a second set of the four sets of integrated anti-tip mechanisms is located at the back of the electronics rack and deploys to the sides of the electronics rack, a third set of the four sets of integrated anti-tip mechanisms is located to the left of the electronics rack and deploys to a front and a back of the electronics rack, and a fourth set of the four sets of integrated anti-tip mechanisms is located to the right of the electronics rack and deploys to the front and the back of the electronics rack.

* * * * *